(12) United States Patent
Ohno et al.

(10) Patent No.: US 11,437,965 B2
(45) Date of Patent: Sep. 6, 2022

(54) VARIABLE GAIN AMPLIFIER AND WIRELESS COMMUNICATION DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shinji Ohno, Kawasaki Kanagawa (JP); Toshifumi Ishimori, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/018,272

(22) Filed: Sep. 11, 2020

(65) Prior Publication Data

US 2021/0297049 A1   Sep. 23, 2021

(30) Foreign Application Priority Data

Mar. 17, 2020   (JP) .............................. JP2020-046632

(51) Int. Cl.
*H03F 1/14*   (2006.01)
*H03G 1/00*   (2006.01)
(Continued)

(52) U.S. Cl.
CPC .............. *H03G 1/0088* (2013.01); *H03F 1/12* (2013.01); *H03F 1/56* (2013.01); *H03F 2200/294* (2013.01); *H03F 2200/381* (2013.01)

(58) Field of Classification Search
CPC ........... H03G 1/0088; H03F 1/56; H03F 1/12; H03F 2200/381; H03F 2200/294
(Continued)

(56) References Cited

U.S. PATENT DOCUMENTS 6,838,933 B2   1/2005  Goyette et al.
8,970,296 B1*  3/2015  Pratt ......................... H03F 3/72
                                                          330/51
(Continued)

FOREIGN PATENT DOCUMENTS

JP   2004274713 A   9/2004
JP   2009100025 A   5/2009
(Continued)

*Primary Examiner* — Khanh V Nguyen
*Assistant Examiner* — Khiem D Nguyen
(74) *Attorney, Agent, or Firm* — Kim & Stewart LLP

(57) ABSTRACT

A variable gain amplifier according to an embodiment comprises a first path, a matching circuit, an amplifier circuit, a second path, and a third path. The first path includes an attenuation circuit, has one end connected to a first input terminal, and attenuates an input signal and outputs an attenuated signal. The matching circuit has one end connected to the other end of the first path. The amplifier circuit has an input connected to the other end of the matching circuit and an output connected to a first output terminal, and amplifies an input signal. The second path is connected in parallel to the first path. The third path has one end connected to the first input terminal, and the other end connected to the first output terminal.

17 Claims, 18 Drawing Sheets

(51) Int. Cl.
  *H03F 1/56* (2006.01)
  *H03F 1/12* (2006.01)

(58) Field of Classification Search
  USPC .................................. 330/51, 302–306, 296
  See application file for complete search history.

(56) References Cited

U.S. PATENT DOCUMENTS

| | | |
|---|---|---|
| 10,008,996 B2 | 6/2018 | Duong et al. |
| 10,033,332 B2 | 7/2018 | Seshita et al. |

FOREIGN PATENT DOCUMENTS

| | | | |
|---|---|---|---|
| JP | 2014027501 A | 2/2014 | |
| JP | 2018042029 A | 3/2018 | |

* cited by examiner

| OPERATION MODE | VDD LNA | VB1 | VB2 | SW1 | SW2 | SW3 | SW4 | SW5 |
|---|---|---|---|---|---|---|---|---|
| HIGH GAIN | 0.8V | 0.35V | 1.6V | H | L | L | L | H |
| LOW GAIN | 0.8V | 0.35V | 1.6V | L | H | H | L | H |
| FIRST BYPASS | 0V | 1.6V | 0V | L | L | L | H | L |

FIG. 6

VARIABLE GAIN AMPLIFIER AND WIRELESS COMMUNICATION DEVICE

CROSS-REFERENCE TO RELATED APPLICATIONS

This application is based upon and claims the benefit of priority from the prior Japanese Patent Application No. 2020-046632, filed on Mar. 17, 2020 the entire contents of which are incorporated herein by reference.

FIELD

Embodiments of the present invention relate to a variable gain amplifier and wireless communication device.

BACKGROUND

A low noise amplifier is used to amplify a wireless signal received from a base station mainly in a wireless communication terminal such as a smartphone. The level of a signal received by a low noise amplifier differs according to the distance between the base station and the wireless communication terminal, and the like. Therefore, some low noise amplifiers amplify a received signal when the signal is small, and pass a received signal without any processing (hereinafter, also "pass-through the signal") using a bypass circuit without amplifying the signal by an amplifier circuit when the signal is large. Such lower noise amplifiers can switch only whether to amplify a signal or not.

BRIEF DESCRIPTION OF THE DRAWINGS

FIG. 6 is a diagram illustrating a correspondence relation among operation modes of the variable gain amplifier;

DETAILED DESCRIPTION

Figure 1:
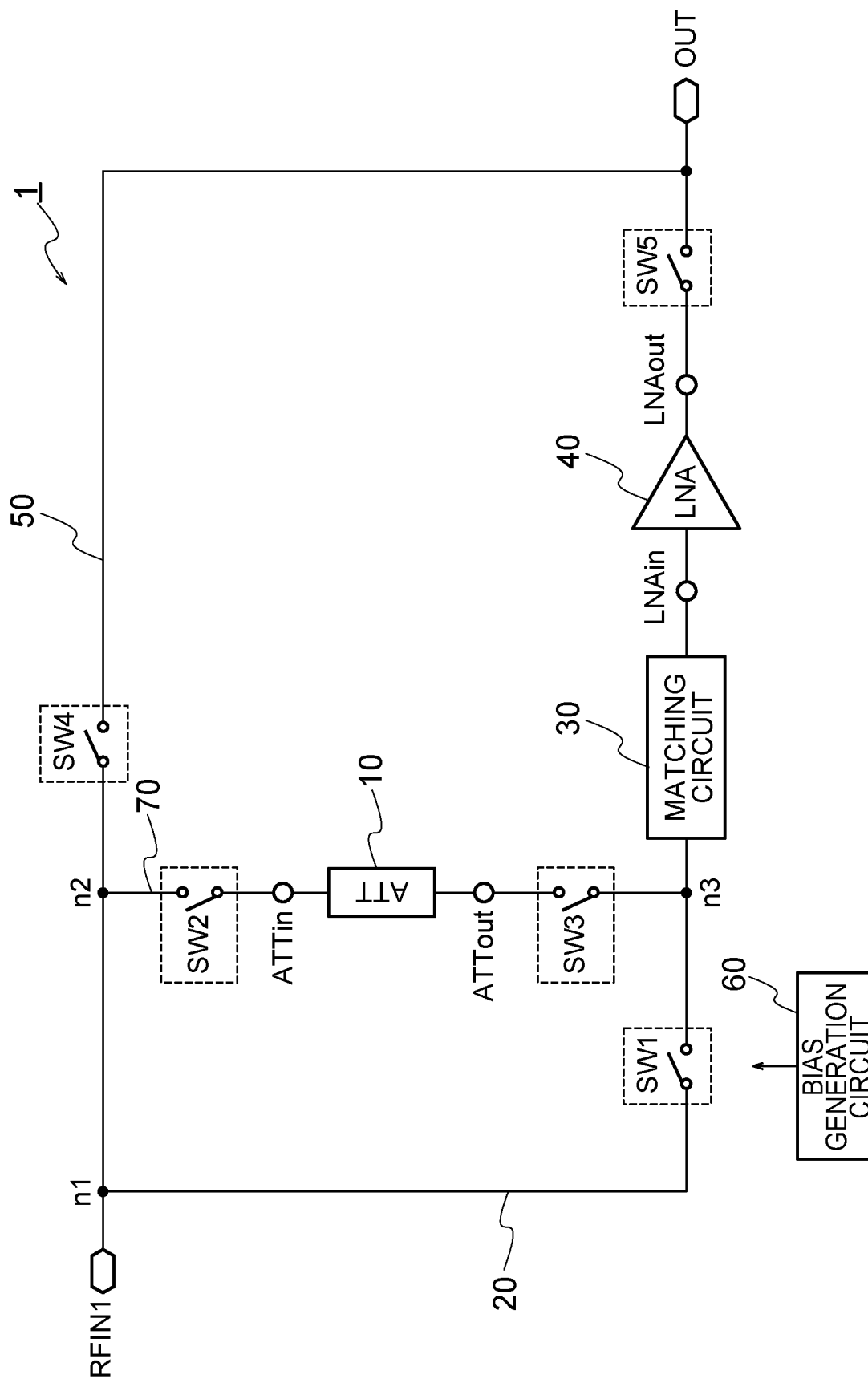
FIG. 1 is a block diagram illustrating a configuration of a variable gain amplifier.

A variable gain amplifier according to an embodiment comprises a first path, a matching circuit, an amplifier circuit, a second path, and a third path. The first path includes an attenuation circuit, has one end connected to a first input terminal, and attenuates an input signal and outputs an attenuated signal. The matching circuit has one end connected to the other end of the first path. The amplifier circuit has an input connected to the other end of the matching circuit and an output connected to a first output terminal, and amplifies an input signal. The second path is connected in parallel to the first path. The third path has one end connected to the first input terminal, and the other end connected to the first output terminal.

A variable gain amplifier and a wireless communication device according to embodiments of the present invention will now be explained in detail with reference to the accompanying drawings. The embodiments described below are only examples of the embodiments of the present invention and it is not to be understood that the present invention is limited to these embodiments. In the drawings referred to in the embodiments, same parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings.

First Embodiment

A configuration of a variable gain amplifier 1 according to a first embodiment is explained with reference to FIGS. 1 to 5. FIG. 1 is a block diagram illustrating the configuration of the variable gain amplifier 1. The variable gain amplifier 1 according to the present embodiment can be mounted on, for example, various types of wireless communication devices that handle a high-frequency signal.

As illustrated in FIG. 1, the variable gain amplifier 1 according to the present embodiment includes a first input terminal RFIN1, switch circuits SW1 to SW5, an attenuation path 70, a first bypass path 20, a matching circuit 30, a high-frequency low noise amplifier (LNA) 40, a second bypass path 50, a bias generation circuit 60, and an output terminal OUT. For example, a high-frequency signal is supplied to the first input terminal RFIN1.

The variable gain amplifier 1 is placed on, for example, a SOI (Silicon On Insulator) substrate. That is, the first input terminal RFIN1, the switch circuits SW1 to SW5, the attenuation path 70, the first bypass path 20, the matching circuit 30, the high-frequency low noise amplifier 40, the second bypass path 50, the bias generation circuit 60, the output terminal OUT, and the like are provided on the SOI substrate.

The first bypass path 20 is connected between a node n1 and a node n3 and includes the switch circuit SW1. The node n1 is connected to the first input terminal RFIN1. The switch circuit SW1 is connected between the node n1 and the node n3. The node n3 is connected to the switch circuit SW3 and one end of the matching circuit 30. The switch circuit SW1 switches the high-frequency signal on the first bypass path 20 to either a conduction state or a non-conduction state.

Figure 2:
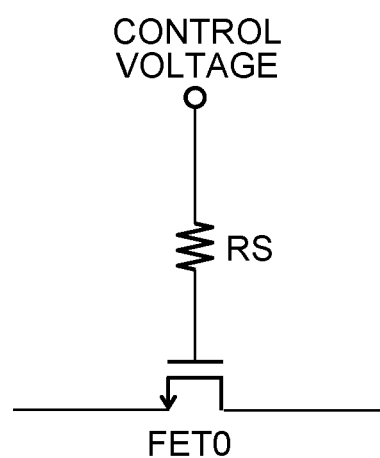
FIG. 2 is a diagram illustrating a configuration example of a switch circuit.

FIG. 2 is a diagram illustrating a configuration example of the switch circuit SW1. The switch circuit SW1 has, for example, an N-type transistor FET0 and a resistor RS. The switch circuit SW1 is operated to be ON and OFF according to a control voltage supplied to a control terminal via the resistor RS. For example, the switch circuit SW1 is brought into a conduction state (ON) when the control signal has an H level (a high potential) and is brought into a non-conduction state (OFF) when the control signal has an L level (a low potential). While being brought into a conduction state (ON) when the control signal has an H level and a non-conduction state (OFF) when the control signal has an L level, the switch circuit SW1 according to the present embodiment is not limited thereto. For example, the switch circuit SW1 may be configured to be brought into a conduction state (ON) when the control signal has an L level and a non-conduction state (OFF) when the control signal has an H level. The configuration of the switch circuit SW1 is not limited to the N-type transistor.

The switch circuits SW2 to SW5 according to the present embodiment have identical configurations to that of the switch circuit SW1. That is, the switch circuits SW2 to SW5 are turned ON when the relevant control signals have an H level and are turned OFF when the control signals have an L level. The switch circuit SW2 or the switch circuit SW3 according to the present embodiment corresponds to a first switch circuit, the switch circuit SW1 corresponds to a second switch circuit, and the switch circuit SW4 corresponds to a third switch circuit.

The attenuation path 70 has one end connected to a node n2 and the other end connected to the node n3, and includes the switch circuits SW2 and SW3 and an attenuation circuit (ATT) 10. The node n2 is connected to the first input terminal RFIN1.

The switch circuit SW2 has one end connected to the node n2 and the other end connected to an input terminal ATTin of the attenuation circuit 10.

The attenuation circuit 10 has the input terminal ATTin connected to the first input terminal RFIN1 via the switch circuit SW2 and attenuates an input high-frequency signal to output an attenuated signal.

The switch circuit SW3 has one end connected to an output terminal ATTout of the attenuation circuit 10 and the other end connected to the node n3. The node n1 according to the present embodiment corresponds to a first node and the node n2 corresponds to a second node.

Figure 3:
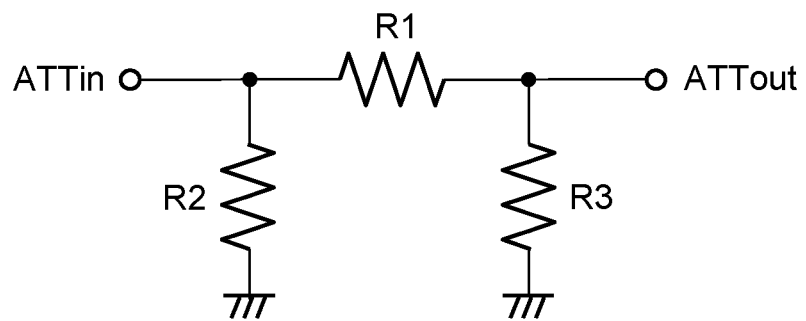
FIG. 3 is a diagram illustrating a circuit configuration example of an attenuation circuit.

FIG. 3 is a diagram illustrating a circuit configuration example of the attenuation circuit 10. As illustrated in FIG. 3, the input terminal ATTin is connected to one end of a resistor R2 and is connected to one end of a resistor R1. The other end of the resistor R2 is connected to the ground and the other end of the resistor R1 is connected to one end of a resistor R3 and is connected to the output terminal ATTout. The other end of the resistor R3 is connected to the ground. In this way, the attenuation circuit 10 is constituted of, for example, an impedance conversion circuit with a n-type configuration. Because this impedance conversion circuit is constituted only of the resistors, a signal is attenuated between the input and the output while the frequency characteristics are flat. The attenuation circuit 10 is not limited to the impedance conversion circuit with the n-type configuration and a general impedance conversion circuit may be used. For example, the attenuation circuit 10 may include an inductor or a capacitor.

The matching circuit 30 has an input connected to the node n3 and an output connected to an input terminal LNAin of the high-frequency low noise amplifier 40.

Figure 4:
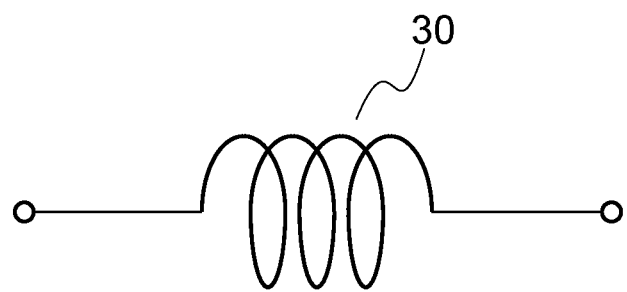
FIG. 4 is a diagram illustrating an example of a matching circuit.

FIG. 4 is a diagram illustrating an example of the matching circuit 30. The matching circuit 30 is, for example, an inductor. The matching circuit 30 performs impedance matching of a high-frequency signal input from the first input terminal RFIN1, for example, an input signal of a wireless frequency being 1.9 GHz so as to optimize an optimal gain or a noise factor NF with respect to the high-frequency low noise amplifier 40.

An output terminal LNAout of the high-frequency low noise amplifier 40 is connected to the output terminal OUT via the switch circuit SW5. The high-frequency low noise amplifier 40 amplifies a high-frequency signal supplied from the matching circuit 30 and outputs an amplified signal to the output terminal OUT.

Figure 5:
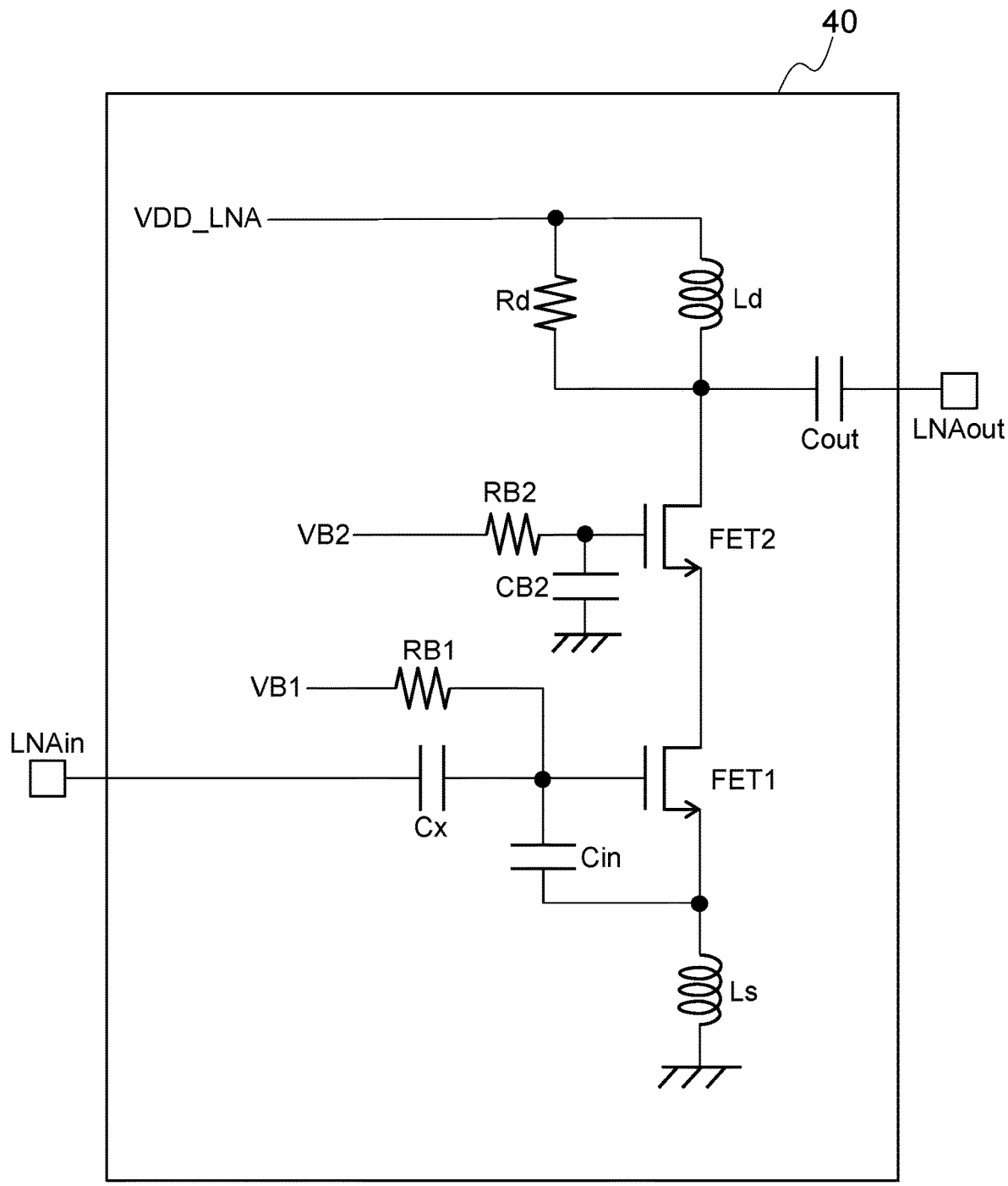
FIG. 5 is a diagram illustrating a circuit configuration example of a high-frequency low noise amplifier.

FIG. 5 is a diagram illustrating a circuit configuration example of the high-frequency low noise amplifier 40.

The high-frequency low noise amplifier 40 in FIG. 5 includes an N-type transistor FET1, an N-type transistor FET2, inductors Ld and Ls, resistors Rd, RB1, and RB2, and capacitors Cin, Cx, Cout, and CB2. Details of the high-frequency low noise amplifier 40 will be explained later.

As illustrated in FIG. 1, the second bypass path 50 includes the switch circuit SW4 and has one end connected to the node n2 and the other end connected to the output terminal OUT. The second bypass path 50 brings a high-frequency signal from the first input terminal RFIN1 connected via the node n2 into conduction to the output terminal OUT when in a first bypass mode.

The bias generation circuit 60 switches the voltage level among a voltage Vdd_LNA (FIG. 5), a bias voltage VB1 (FIG. 5), and a bias voltage VB2 (FIG. 5) according to whether the operation mode is a gain mode or the first bypass mode, and outputs the voltage. The gain mode includes a high gain mode and a low gain mode as will be described later. In the present embodiment, the high-frequency low noise amplifier 40 performs identical driving to amplify a high-frequency signal in the high gain mode and the low gain mode. The bias generation circuit 60 also generates control voltages for the switch circuits SW1 to SW5.

A configuration of the high-frequency low noise amplifier 40 is explained below in more detail. As illustrated in FIG. 5, the bias generation circuit 60 generates the bias voltage VB2 to enable the transistor FET2 to be turned ON and sets the bias voltage VB1 to be lower than a drain-source voltage of the transistor FET1 in the gain mode. The bias generation circuit 60 generates the bias voltage VB2 to enable the transistor FET2 to be turned OFF and generates the bias voltage VB1 so as to bring the channel of the transistor FET1 into a strong inversion state in the first bypass mode.

A high-frequency signal is input to the gate of the transistor FET1 from the first input terminal RFIN1 via the capacitor Cx. The capacitor Cx is a capacitor for direct current blocking and is set to a large value so as not to adversely affect the characteristic impedance.

The bias voltage VB1 output from the bias generation circuit 60 is input to the gate of the transistor FET1 via the resistor RB1. The resistor RB1 is provided to prevent a high-frequency signal from penetrating the output terminal side of the bias generation circuit 60 that outputs the bias voltage VB1.

The capacitor Cin is connected between the gate and the source of the transistor FET1. One end of each of the resistor Rd, the inductor Ld, and the capacitor Cout is connected to the drain of the transistor FET2. The voltage Vdd_LNA output from the bias generation circuit 60 is input to the other end of each of the resistor Rd and the inductor Ld. The output terminal LNAout of the variable gain amplifier 1 is connected to the other end of the capacitor Cout.

The resistor Rd is a ballast resistor and has a function to suppress oscillation and to lower the output impedance. Output matching is obtained by the inductor Ld and the capacitor Cout. Provision of the resistor Rd can reduce the value of the inductor Ld.

The bias voltage VB2 output from the bias generation circuit 60 is input to the gate of the transistor FET2 via the resistor RB2. The capacitor (earth capacitor) CB2 is connected between an output terminal of the bias generation circuit 60 that outputs the bias voltage VB2 and a ground node. The resistor RB2 has a high resistance and provision of the resistor RB2 can prevent leakage of a high-frequency signal from the gate of the transistor FET2 while the transistor FET2 is ON. The transistor FET2 functions as a switch that switches whether to bring the source of the transistor FET1 into conduction to one end of the inductor Ls.

The variable gain amplifier 1 can switch among at least three operation modes in which the gains are different from each other, that is, a high gain mode, a low gain mode, and a first bypass mode. The variable gain amplifier 1 switches among the three operation modes by switching the conduction states of the first bypass path 20, the second bypass path 50, and the attenuation path 70. The high gain mode is a mode in which a high-frequency signal is amplified by the matching circuit 30 and the high-frequency low noise amplifier 40 through the first bypass path 20. That is, a high-frequency signal is amplified without passing the attenuation path 70 in the high gain mode. Meanwhile, the low gain mode is a mode in which a high-frequency signal is amplified by the matching circuit 30 and the high-frequency low noise amplifier 40 through the attenuation path 70. The first bypass mode is a mode in which a high-frequency signal is output to the output terminal OUT through the second bypass path 50. In the first bypass mode, a high-frequency signal is output without passing the attenuation circuit 10, the matching circuit 30, and the high-frequency low noise amplifier 40.

FIG. 6 is a diagram illustrating a correspondence relation among the operation modes of the variable gain amplifier 1, the voltage Vdd_LNA, the bias voltage VB1, the bias voltage VB2, and the control voltages for the switch circuits SW1 to SW5. As described above, the bias generation circuit 60 generates the bias voltage VB1 for driving the gate of the transistor FET1, the bias voltage VB2 for switching the transistor FET2 between ON and OFF, and the voltage Vdd_LNA input to the other end of each of the resistor Rd and the inductor Ld. The voltage Vdd_LNA is a voltage used to set the drain voltage of the transistor FET1.

As illustrated in FIG. 6, for example, Vdd_LNA=0.8 volt, VB1=0.35 volt, and VB2=1.6 volt in the high gain mode. The control voltages for the switch circuits SW1 to SW5 are H, L, L, L, and H, respectively in the high gain mode. On the other hand, the control voltages for the switch circuits SW1 to SW5 are L, H, H, L, and H, respectively, in the low gain mode.

In the first bypass mode, Vdd_LNA=0 volt, VB1=1.6 volt, and VB2=0 volt. At that time, the control voltages for the switch circuits SW1 to SW5 are L, L, L, H, and L, respectively.

Figure 7:
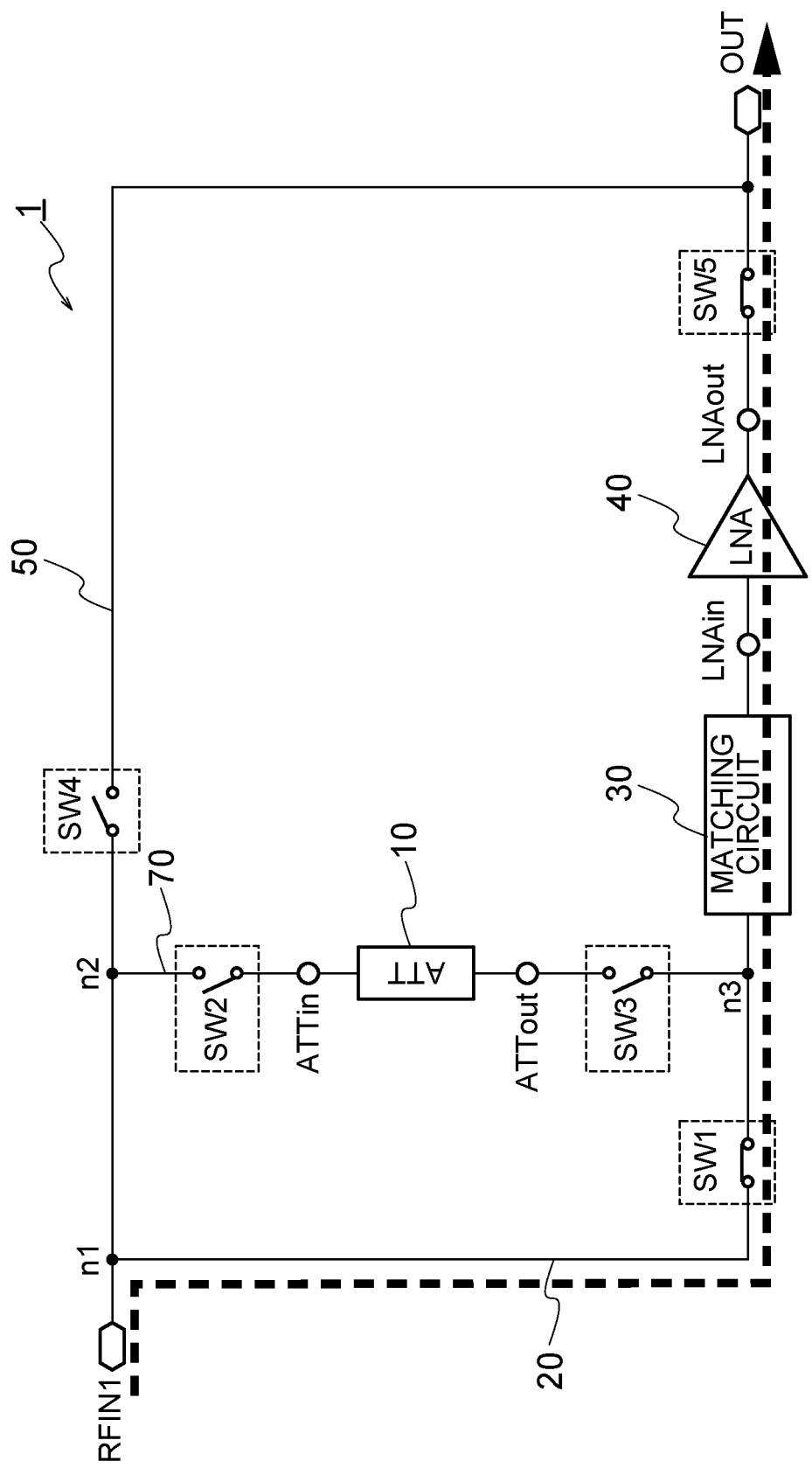
FIG. 7 is a diagram illustrating a flow of a high-frequency signal in a high gain mode.

FIG. 7 is a diagram illustrating a flow of a high-frequency signal in the high gain mode. As illustrated in FIG. 7, the switch circuits SW1 and SW5 are turned ON, the switch circuits SW2, SW3, and SW4 are turned OFF, and a signal passes a path indicated by a broken line. Accordingly, a signal input from the first input terminal RFIN1 is amplified by the high-frequency low noise amplifier 40 and is output from the output terminal OUT. Because the attenuation circuit 10 is not included in the signal path in the high gain mode, a high gain can be achieved while NF reduction is suppressed in the high gain mode.

Figure 8:
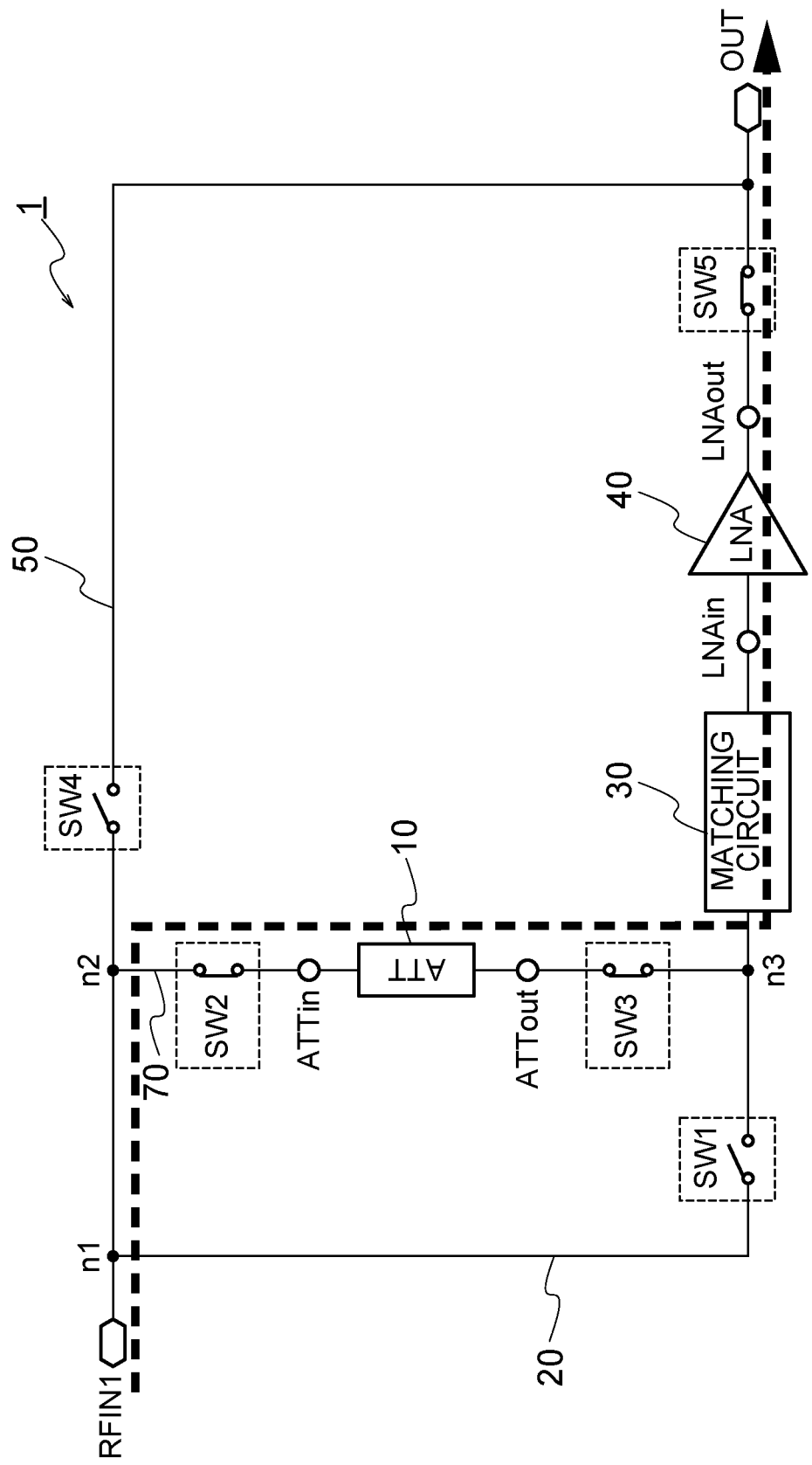
FIG. 8 is a diagram illustrating a flow of a high-frequency signal in a low gain mode.

FIG. 8 is a diagram illustrating a flow of a high-frequency signal in the low gain mode. As illustrated in FIG. 8, the switch circuits SW2, SW3, and SW5 are turned ON, the switch circuits SW1 and SW4 are turned OFF, and a signal passes a path indicated by a broken line. Accordingly, a signal input from the first input terminal RFIN1 is attenuated by the attenuation circuit 10 and is thereafter amplified by the high-frequency low noise amplifier 40, and a signal of a lower output level than in the high gain mode is output from the output terminal OUT. Also in the low gain mode, signal distortion can be suppressed because the signal passes the attenuation circuit 10 before being input to the high-frequency low noise amplifier 40 and is accordingly attenuated.

Figure 9:
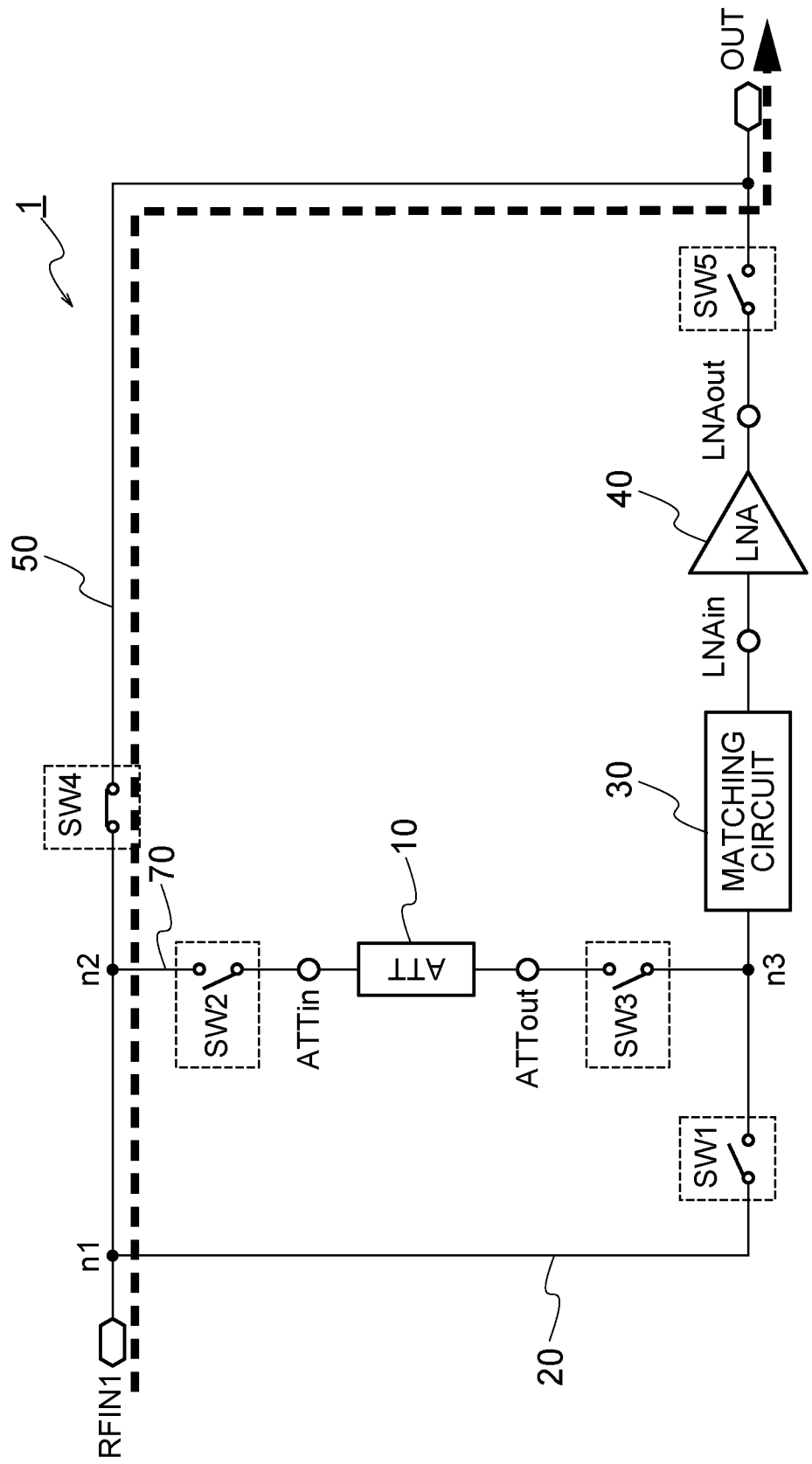
FIG. 9 is a diagram illustrating a flow of a high-frequency signal in a first bypass mode.

FIG. 9 is a diagram illustrating a flow of a high-frequency signal in the first bypass mode. As illustrated in FIG. 9, the switch circuit SW4 is turned ON, the switch circuits SW1, SW2, SW3, and SW5 are turned OFF, and a signal passes a path indicated by a broken line. Accordingly, a signal input from the first input terminal RFIN1 is output as it is from the output terminal OUT without being attenuated or amplified.

As described above, according to the present embodiment, the variable gain amplifier 1 includes the attenuation path 70 including the attenuation circuit 10, the matching circuit 30, and the low noise amplifier 40, which are connected in series. The variable gain amplifier 1 includes the first bypass path 20 that is connected in parallel to the attenuation path 70 and that bypasses the attenuation path 10 in the high gain mode, and the second bypass path 50 that has one end connected to the input terminal RFIN1 and the other end connected to the output terminal OUT and that diverts a signal to the output terminal OUT in the first bypass mode. Accordingly, the variable gain amplifier 1 can switch among a plurality of operation modes where the gains are different from each other to adjust the gain of an output signal by switching the conductive path of the signal.

The variable gain amplifier 1 can suppress NF reduction in the high gain mode because the attenuation circuit 10 is not included in the signal path in the high gain mode. Further, distortion can be suppressed also in the low gain mode because a signal passes the attenuation circuit 10 before being input to the high-frequency low noise amplifier 40 and is accordingly attenuated. The variable gain amplifier 1 outputs a signal without amplifying the signal in the first bypass mode. Therefore, the variable gain amplifier 1 reduces power consumption required for signal amplification and suppresses occurrence of signal noise.

Second Embodiment

A variable gain amplifier 1a according to a second embodiment is different from the variable gain amplifier 1 according to the first embodiment in further including a second bypass mode that reduces return loss of the first input terminal RFIN1 and the output terminal OUT. In the following descriptions, the difference from the variable gain amplifier 1 according to the first embodiment will be explained.

Figure 10:
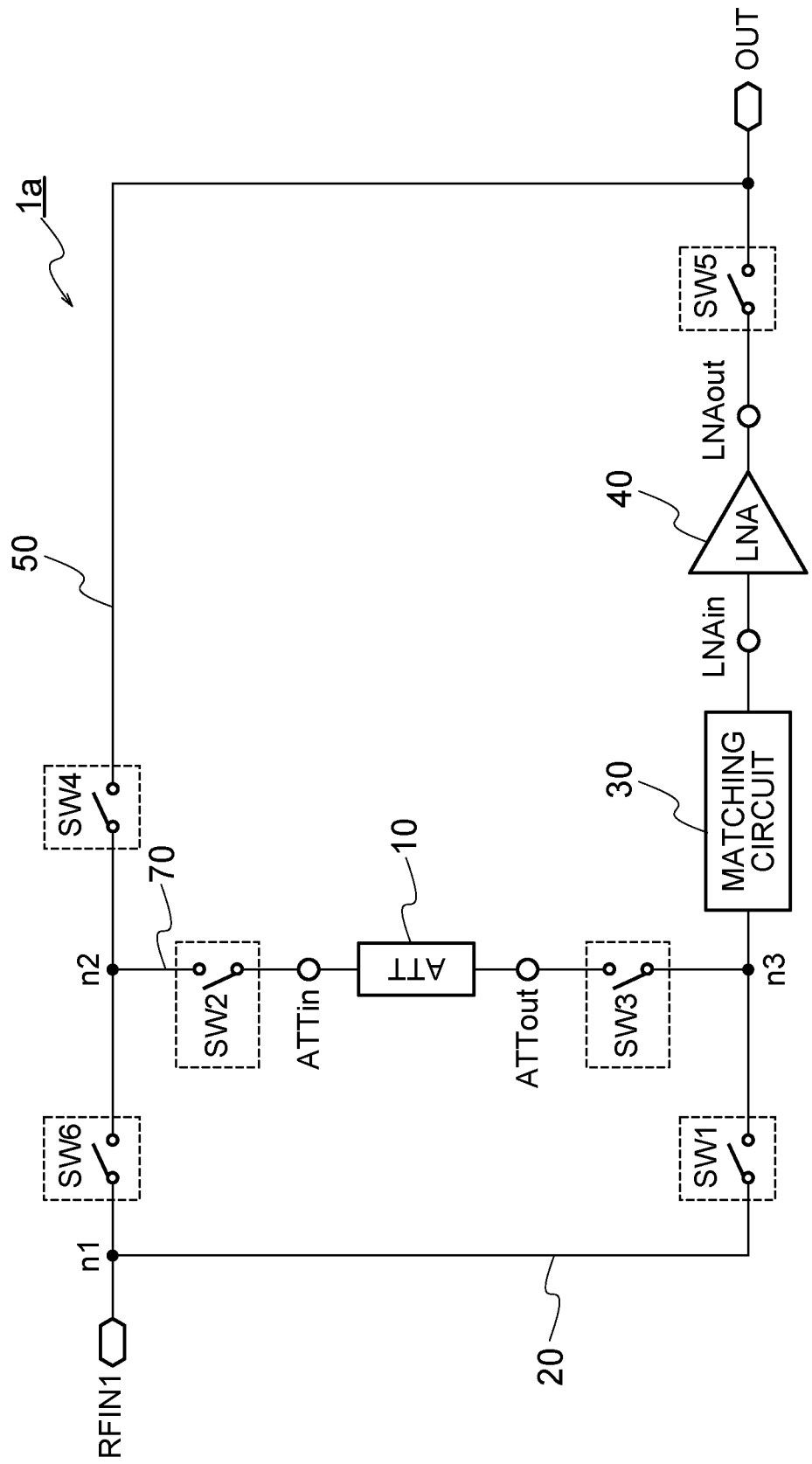
FIG. 10 is a block diagram of a variable gain amplifier according to a second embodiment.

FIG. 10 is a block diagram of the variable gain amplifier 1a according to the second embodiment. As illustrated in FIG. 10, the variable gain amplifier 1a further includes a switch circuit SW6 between the node n1 and the node n2. The node n2 is connected to the first input terminal RFIN1 via the switch circuit SW6 and the node n1. The switch circuit SW6 in the present embodiment corresponds to a fourth switch circuit.

Figure 11:
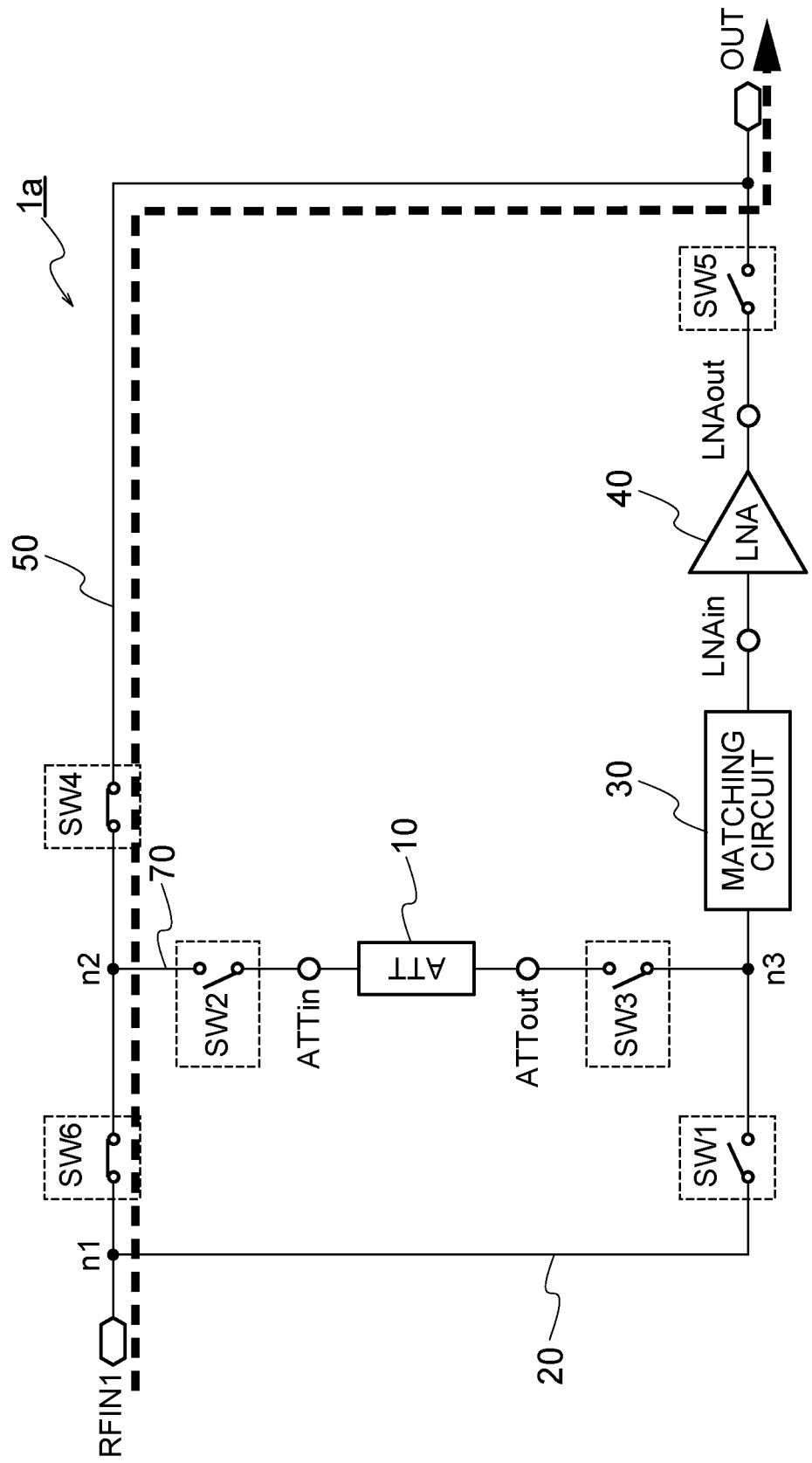
FIG. 11 is a diagram illustrating a flow of a high-frequency signal in a first bypass mode according to the second embodiment.

FIG. 11 is a diagram illustrating a flow of a high-frequency signal in the first bypass mode according to the second embodiment. As illustrated in FIG. 11, the switch circuits SW4 and SW6 are turned ON, the switch circuits SW1, SW2, SW3, and SW5 are turned OFF, and a signal passes a path indicated by a broken line. Accordingly, a signal input from the first input terminal RFIN1 is output as it is from the output terminal OUT. In this case, Vdd_LNA=0 volt, VB1=1.6 volt, and VB2=0 volt, and the control voltages for the switch circuits SW1 to SW6 are L, L, L, H, L, and H, respectively.

Figure 12:
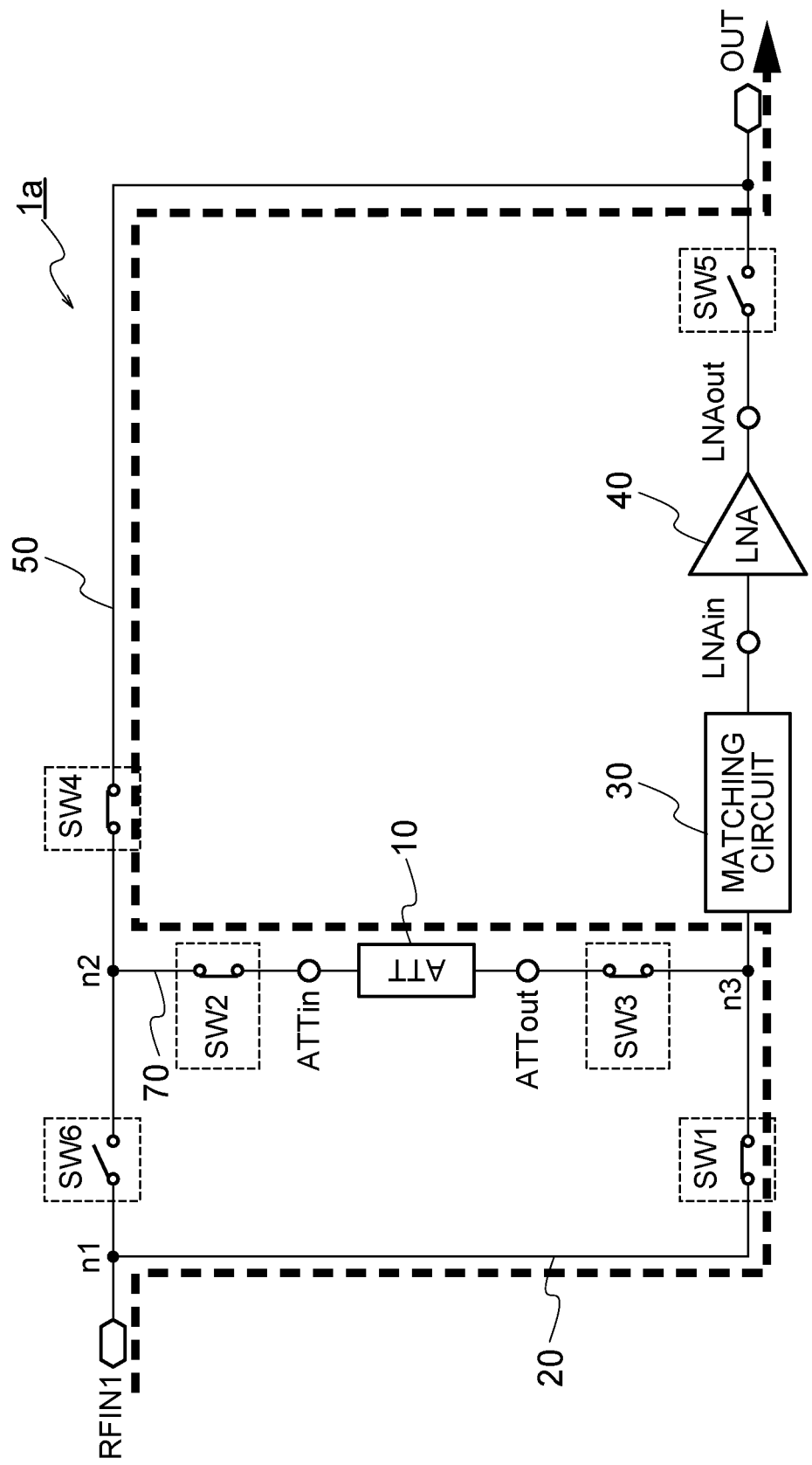
FIG. 12 is a diagram illustrating a flow of a high-frequency signal in a second bypass mode according to the second embodiment.

FIG. 12 is a diagram illustrating a flow of a high-frequency signal in the second bypass mode according to the second embodiment. As illustrated in FIG. 12, the switch circuits SW1, SW2, SW3, and SW4 are turned ON, the switch circuits SW5 and SW6 are turned OFF, and a signal passes a path indicated by a broken line. In this case, a signal input from the first input terminal RFIN1 passes the attenuation circuit 10 to be attenuated, and is output from the output terminal OUT. In a case in which a signal passes this path, the reflected wave is attenuated by the attenuation circuit 10 and therefore the return loss characteristics are improved. At that time, Vdd_LNA=0 volt, VB1=1.6 volt, and VB2=0 volt, and the control voltages for the switch circuits SW1 to SW6 are H, H, H, H, L, and L, respectively.

As explained above, according to the present embodiment, the variable gain amplifier 1a is configured to include the switch circuit SW6 on a path between the node n1 and the node n2. Accordingly, the variable gain amplifier 1a enables a signal input from the first input terminal RFIN1 to pass the attenuation circuit 10 for attenuation, and to be output from the output terminal OUT in the second bypass mode. Therefore, the return loss characteristics are improved because the reflected wave is attenuated by the attenuation circuit 10.

Third Embodiment

A variable gain amplifier 1b according to a third embodiment is different from the variable gain amplifier 1a according to the second embodiment in further including a second input terminal RFIN2. In the following descriptions, the difference from the variable gain amplifier 1a according to the second embodiment will be explained.

Figure 13:
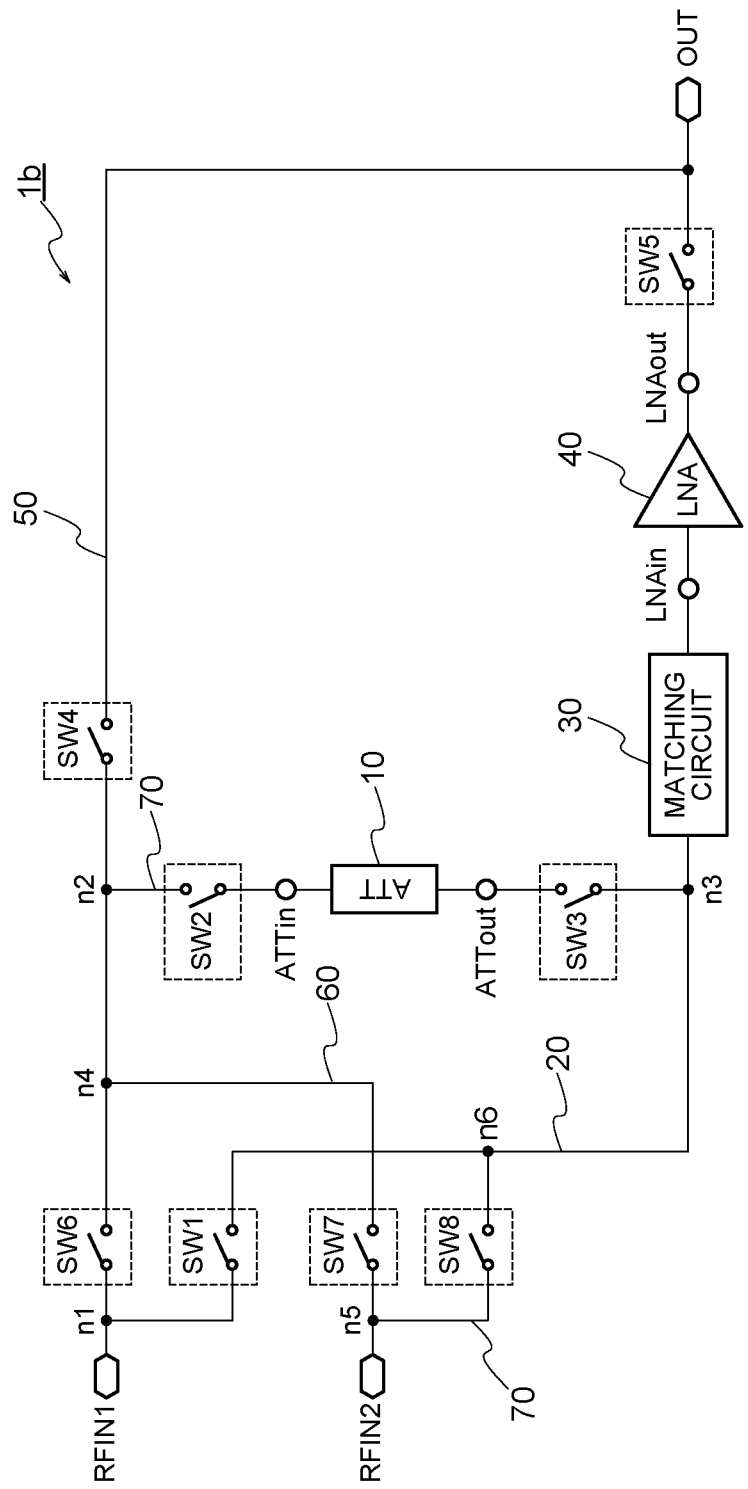
FIG. 13 is a block diagram of a variable gain amplifier according to a third embodiment.

FIG. 13 is a block diagram of the variable gain amplifier 1b according to the third embodiment. As illustrated in FIG. 13, a node n4 is connected to the node n2. A node n6 is connected to the node n3. The variable gain amplifier 1b further includes the second input terminal RFIN2 connected to a node n5. The variable gain amplifier 1b further includes a switch circuit SW7 between the node n4 and the node n5. The variable gain amplifier 1b also includes a switch circuit SW8 between the node n5 and the node n6. The switch circuit SW7 according to the present embodiment corresponds to a fifth switch circuit, and the switch circuit SW8 corresponds to a sixth switch circuit.

Figure 14:
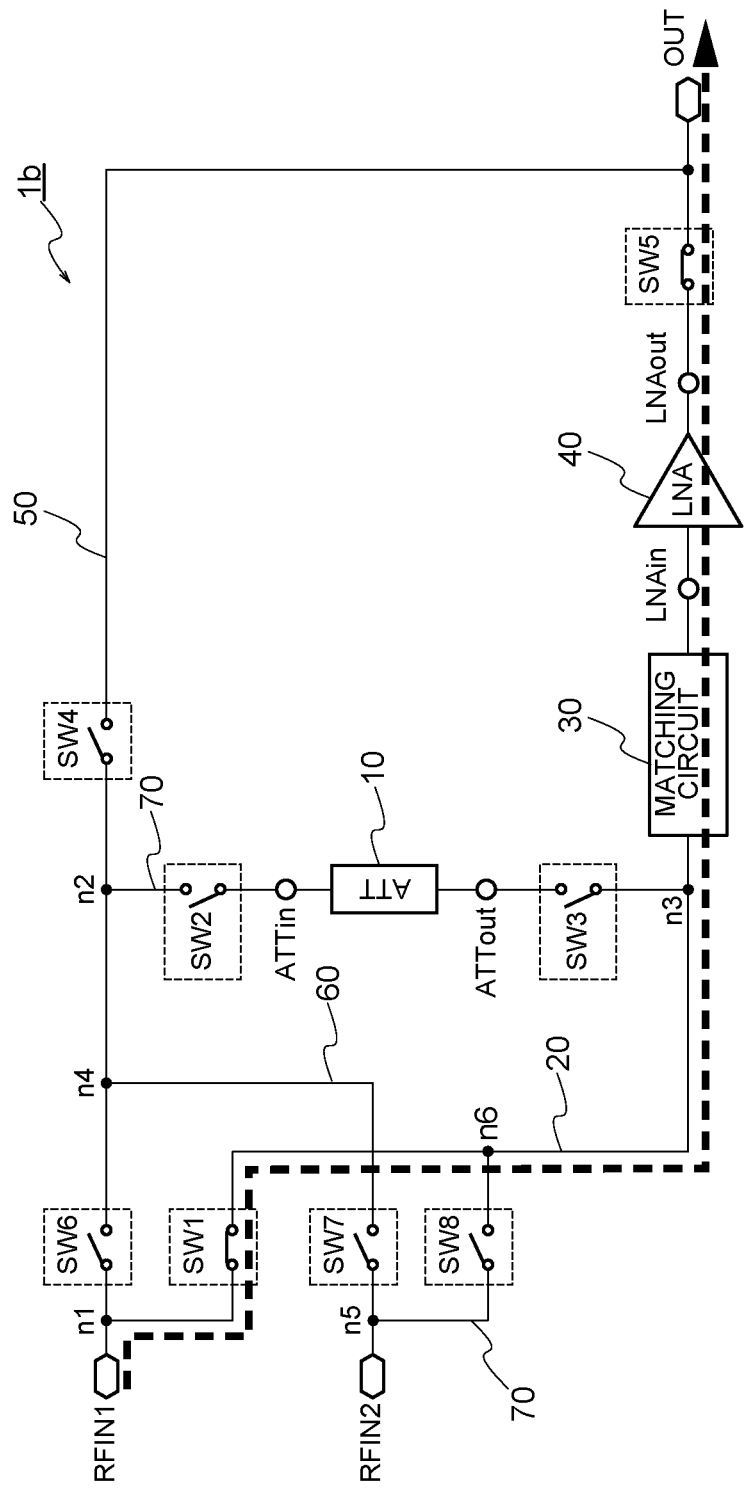
FIG. 14 is a diagram illustrating a flow of a high-frequency signal in a high gain mode according to the third embodiment.

FIG. 14 is a diagram illustrating a flow of a high-frequency signal in the high gain mode according to the third embodiment. As illustrated in FIG. 14, the switch circuits SW1 and SW5 are turned ON, other switch circuits SW are turned OFF, and a signal passes a path indicated by a broken line. Accordingly, a signal input from the first input terminal RFIN1 is amplified by the high-frequency low noise amplifier 40 and is output from the output terminal OUT. Because the attenuation circuit 10 is not included in the signal path of the high gain mode in the high gain mode, a high gain can be achieved while NF reduction is suppressed in the high gain mode. When a high-frequency signal is input from the second input terminal RFIN2, identical processing can be performed by turning ON the switch circuit SW8 instead of the switch circuit SW1.

Figure 15:
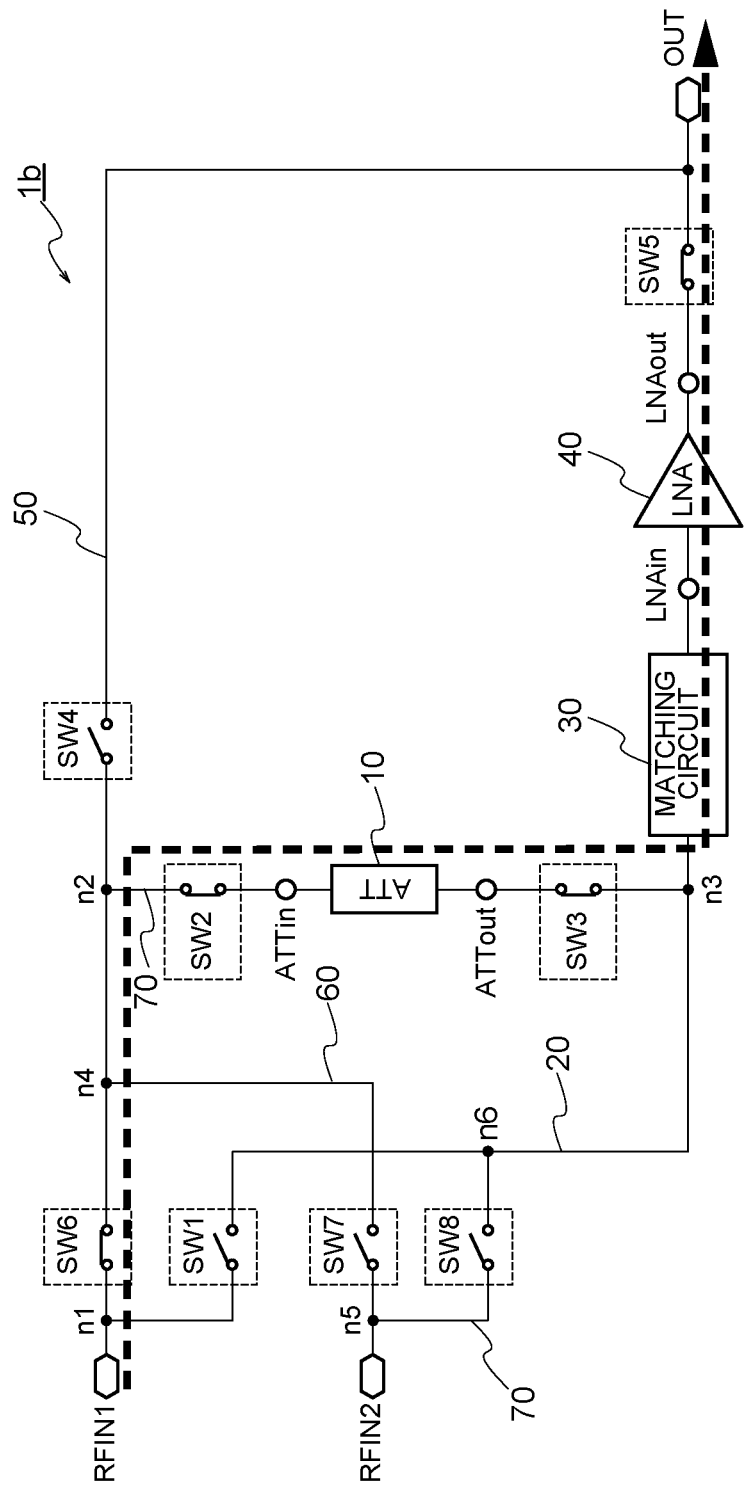
FIG. 15 is a diagram illustrating a flow of a high-frequency signal in a low gain mode according to the third embodiment.

FIG. 15 is a diagram illustrating a flow of a high-frequency signal in the low gain mode according to the third embodiment. As illustrated in FIG. 15, the switch circuits SW2, SW3, SW5, and SW6 are turned ON, the other switch circuits SW are turned OFF, and a signal passes a path indicated by a broken line. Accordingly, a signal input from the first input terminal RFIN1 is attenuated by the attenuation circuit 10 and is thereafter amplified by the high-frequency low noise amplifier 40, and a signal of a lower output level than in the high gain mode is output from the output terminal OUT. Also in the low gain mode, distortion can be suppressed because a signal passes the attenuation circuit 10 before being input to the high-frequency low noise amplifier 40 and is accordingly attenuated. When a high-frequency signal is input from the second input terminal RFIN2, identical processing can be performed by turning ON the switch circuit SW7 instead of the switch circuit SW6.

Figure 16:
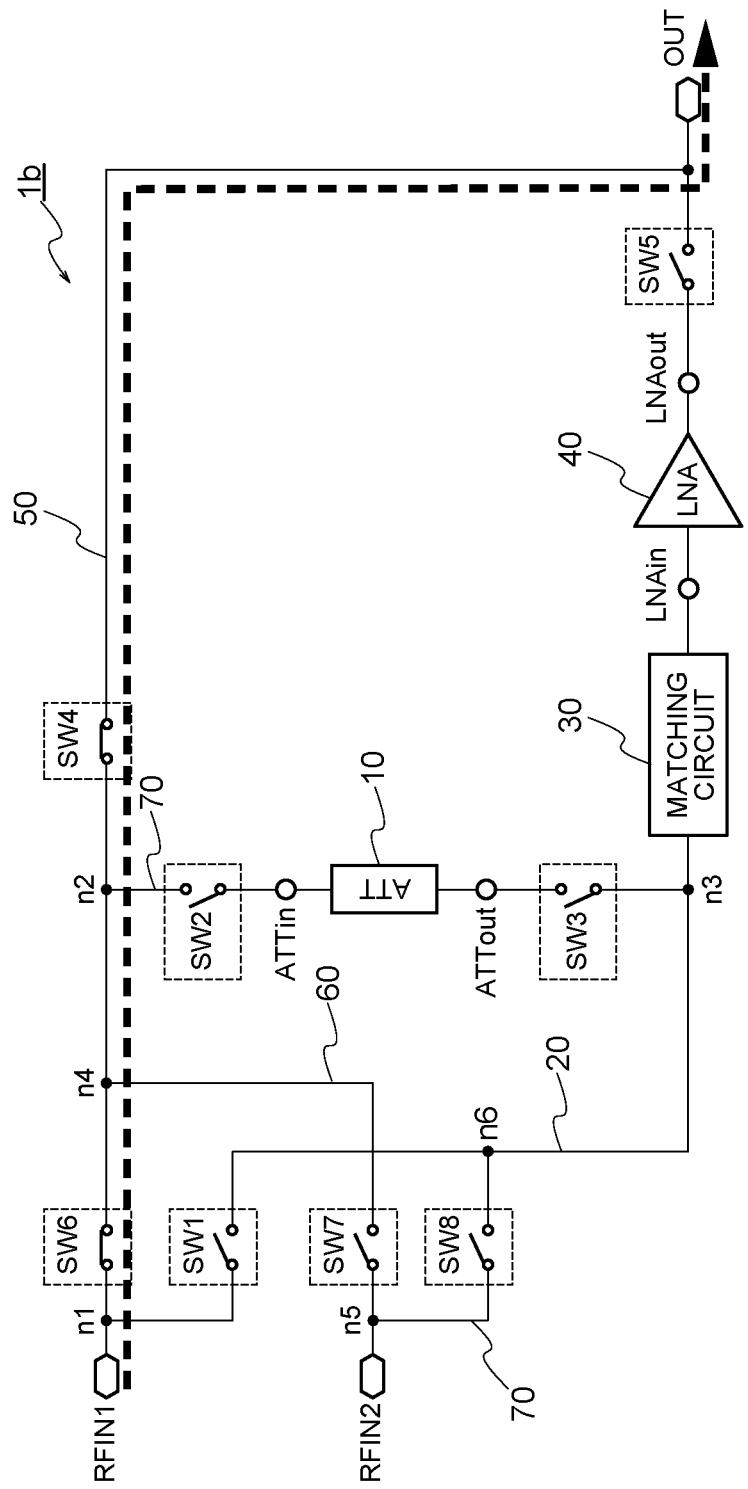
FIG. 16 is a diagram illustrating a flow of a high-frequency signal in a first bypass mode according to the third embodiment.

FIG. 16 is a diagram illustrating a flow of a high-frequency signal in the first bypass mode according to the third embodiment. As illustrated in FIG. 16, the switch circuits SW4 and SW6 are turned ON, the other switch circuits SW are turned OFF, and a signal passes a path indicated by a broken line. Accordingly, a signal input from the first input terminal RFIN1 is output as it is from the output terminal OUT. When a high-frequency signal is input from the second input terminal RFIN2, identical processing can be performed by turning ON the switch circuit SW7 instead of the switch circuit SW6.

Figure 17:
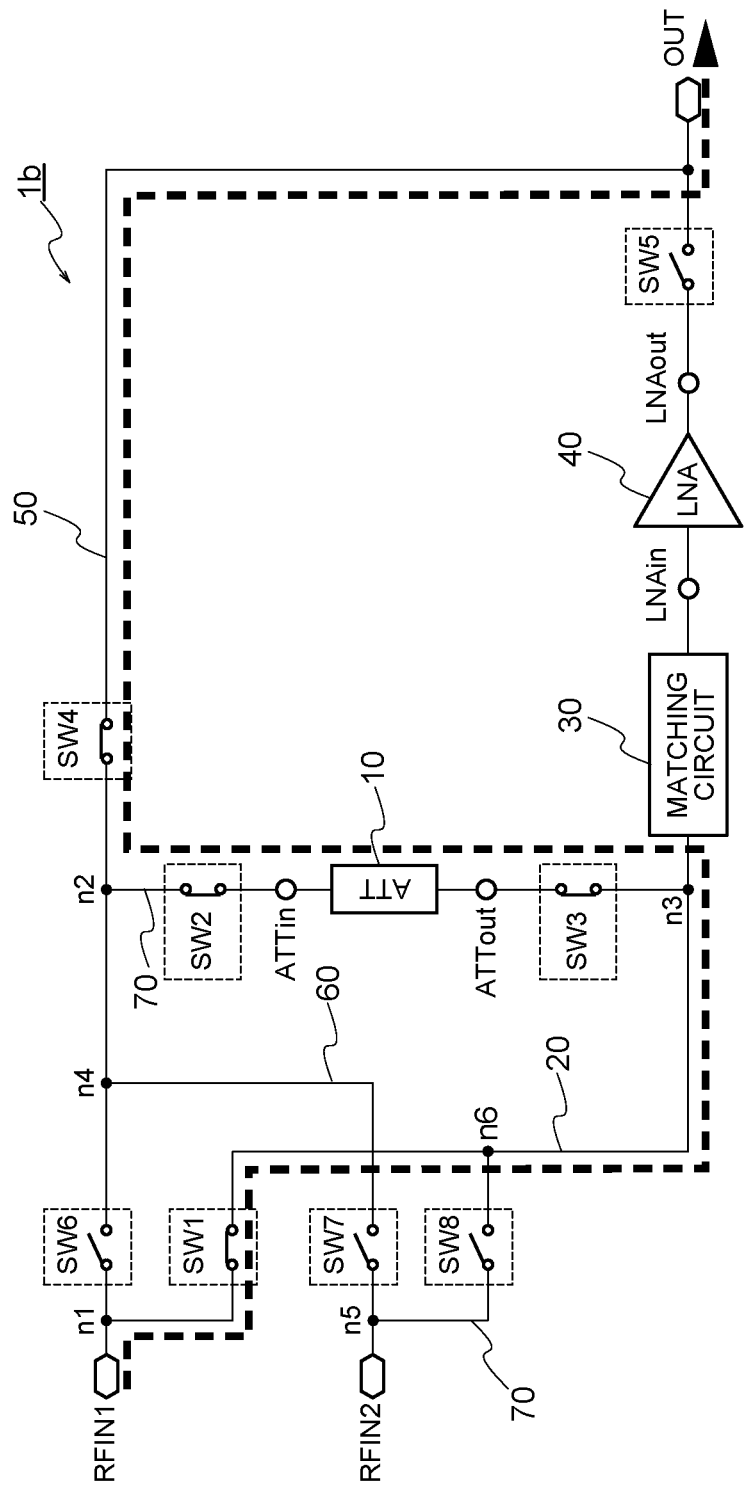
FIG. 17 is a diagram illustrating a flow of a high-frequency signal in a second bypass mode according to the third embodiment.

FIG. 17 is a diagram illustrating a flow of a high-frequency signal in the second bypass mode according to the third embodiment. As illustrated in FIG. 17, the switch circuits SW1, SW2, SW3, and SW4 are turned ON, the other switch circuits SW are turned OFF, and a signal passes a path indicated by a broken line. Accordingly, a signal input from the first input terminal RFIN1 is output as it is from the output terminal OUT. In this case, the signal input from the first input terminal RFIN1 passes the attenuation circuit 10 to be attenuated, and is output from the output terminal OUT. In the case in which a signal passes this path, the reflected wave is attenuated by the attenuation circuit 10 and therefore the return loss characteristics are improved. When a high-frequency signal is input from the second input terminal RFIN2, identical processing can be performed by turning ON the switch circuit SW8 instead of the switch circuit SW1.

As explained above, according to the present embodiment, the NF reduction in the high gain mode and the distortion in the low gain mode can be suppressed also in the case in which the input terminals RFIN1 and RFIN2 are included. In the bypass mode, the signal path can be changed between the first bypass mode and the second bypass mode to be adapted to a case in which the signal intensity is to be maintained or a case in which the return loss is to be reduced.

Fourth Embodiment

A variable gain amplifier 1c according to a fourth embodiment is different from the variable gain amplifier 1 according to the first embodiment in the manner in which the first bypass path and the attenuation path are provided. In the following descriptions, the difference from the variable gain amplifier 1 according to the first embodiment will be explained.

Figure 18:
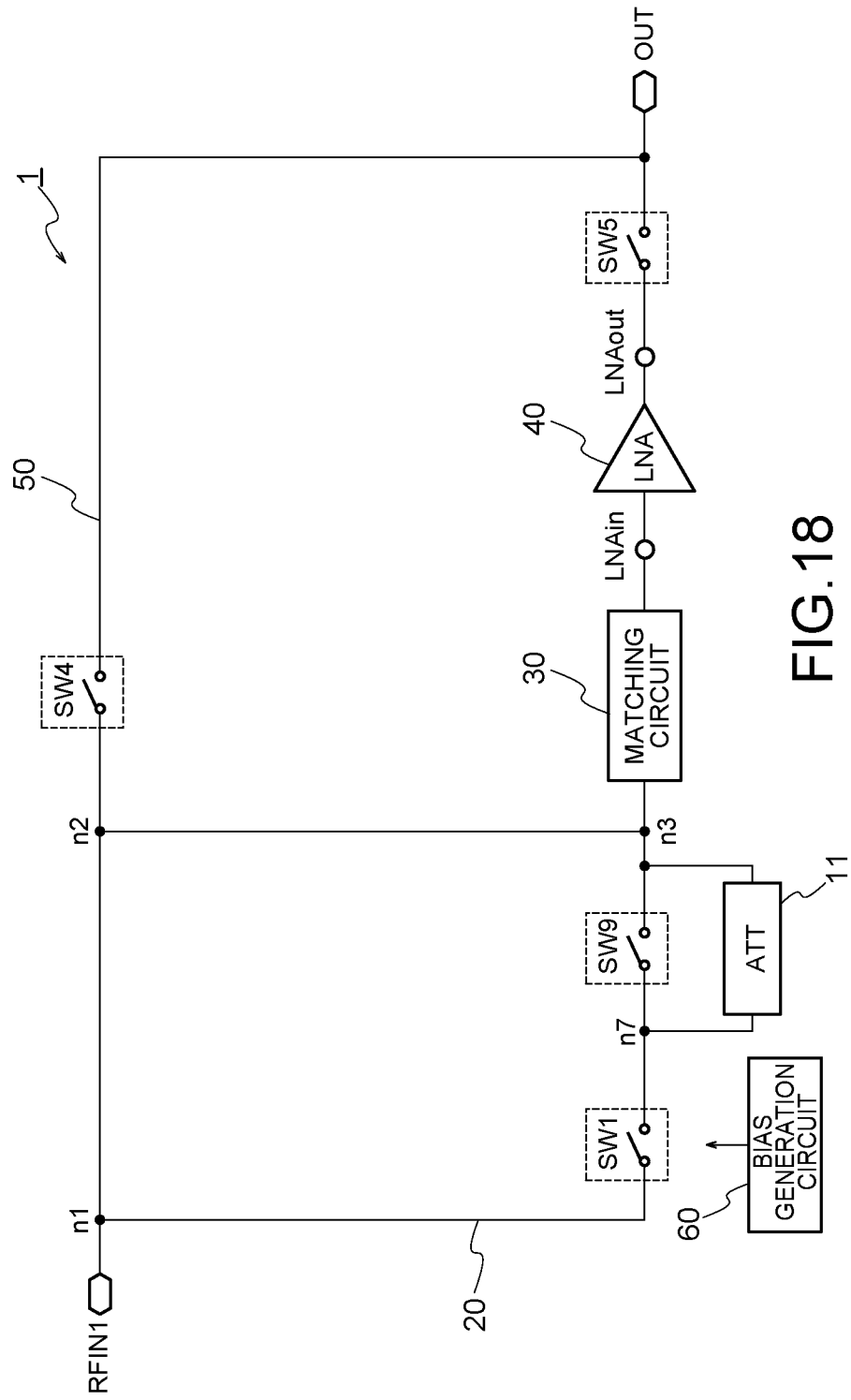
FIG. 18 is a block diagram of a variable gain amplifier according to a fourth embodiment.

FIG. 18 is a block diagram of the variable gain amplifier 1c according to the fourth embodiment. As illustrated in FIG. 18, the variable gain amplifier 1c does not include the switch circuits SW2 and SW3 and the attenuation circuit 10 and further includes a switch circuit SW9 and an attenuation circuit 11.

The variable gain amplifier 1c includes the switch circuit SW9 and the attenuation circuit 11. The switch circuit SW9 is provided between the switch circuit SW1 and the node n3. The attenuation circuit 11 is provided in parallel to the switch circuit SW9. A node n7 is a node between the switch circuit SW9 and the switch circuit SW1. In the variable gain amplifier 1c, a path passing the attenuation circuit 11 between the node n7 and the node n3 corresponds to a first path, that is, an attenuation path. In the variable gain amplifier 1c, a path passing the switch circuit SW9 between the node n7 and the node n3 corresponds to a second path, that is, a first bypass path.

Switching between a high gain mode and a low gain mode in the variable gain amplifier 1c is realized by changing the switch circuit SW9 to conduction or non-conduction in a state in which the switch circuit SW1 is brought to conduction. In the variable gain amplifier 1c, whether a signal input to the node n7 passes the attenuation circuit 11 or is passed-through is changed by switching of the switch circuit SW9. The variable gain amplifier 1c can reduce the total number of switch circuits SW to be provided while insertion loss of the switch circuit SW9 is generated in the high gain mode relative to the variable gain amplifier 1.

While certain embodiments have been described, these embodiments have been presented by way of example only, and are not intended to limit the scope of the inventions. Indeed, the novel devices, methods, and programs described in the present specification may be embodied in a variety of other forms; furthermore, various omissions, substitutions, and changes in the form of the devices, methods, and programs described in the present specification may be made without departing from the spirit of the inventions.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A variable gain amplifier comprising:
a first path having a first end connected to a first input terminal and a second end;
an attenuation circuit between the first and second ends of the first path and configured to attenuate a first input signal received at the first input terminal and to output an attenuated signal at the second end of the first path;
a first switch circuit configured to switch the first path between conduction and non-conduction;
a matching circuit having a first end connected to the second end of the first path;
an amplifier circuit having an input side node connected to a second end of the matching circuit and an output side node connected to a first output terminal, the amplifier circuit configured to amplify a second input signal received from the second end of the matching circuit;
a second path connected in parallel to the first path between the first input terminal and the first end of the matching circuit;
a second switch circuit configured to switch the second path between conduction and non-conduction;
a third path having a first end connected to the first input terminal and a second end connected to the first output terminal; and
a third switch circuit configured to switch the third path between conduction and non-conduction.

2. The variable gain amplifier of claim 1, wherein the second switch circuit and the third switch circuit are in a non-conduction state and the first switch circuit is in a conduction state in a first mode of a plurality of modes with different gains.

3. The variable gain amplifier of claim 2, wherein the first switch circuit and the third switch circuit are in a non-conduction state and the second switch circuit is in a conduction state in a second mode of the plurality of modes, the first and second modes having different gains.

4. The variable gain amplifier of claim 3, wherein the first switch circuit and the second switch circuit are in a non-conduction state and the third switch circuit is in a conduction state in a third mode of the plurality of modes, the first and third modes having different gains.

5. The variable gain amplifier of claim 4, further comprising:
a fourth switch circuit, wherein
the second path is connected to the first input terminal at a first node,
the first end of the first path and the first end of the third path are connected at a second node, and
the fourth switch circuit is between the first node and the second node.

6. The variable gain amplifier of claim 5, wherein the fourth switch circuit is in a non-conduction state and the first switch circuit, the second switch circuit, and the third switch circuit are in a conduction state in a fourth mode of the plurality of modes, the first and fourth modes having different gains.

7. The variable gain amplifier of claim 5, further comprising:
a fifth switch circuit between a second input terminal and the second node; and
a sixth switch circuit between the second input terminal and the first end of the matching circuit.

8. The variable gain amplifier of claim 1, wherein the first path, the second path, the third path, and the amplifier circuit are on a silicon-on-insulator (SOI) substrate.

9. A wireless communication device comprising:
a variable gain amplifier including:
- a first path having a first end connected to a first input terminal and a second end;
- an attenuation circuit between the first and second ends of the first path and configured to attenuate a first input signal received at the first input terminal and to output an attenuated signal at the second end of the first path;
- a first switch circuit configured to switch the first path between conduction and non-conduction;
- a matching circuit having a first end connected to the second end of the first path;
- an amplifier circuit having an input side node connected to a second end of the matching circuit and an output side node connected to a first output terminal, the amplifier circuit configured to amplify a second input signal received from the second end of the matching circuit;
- a second path connected in parallel to the first path between the first input terminal and the first end of the matching circuit;
- a second switch circuit configured to switch the second path between conduction and non-conduction;
- a third path having a first end connected to the first input terminal and a second end connected to the first output terminal; and
- a third switch circuit configured to switch the third path between conduction and non-conduction.

10. The wireless communication device of claim 9, wherein
the variable gain amplifier has a plurality of modes with different gains, and
the second switch circuit and the third switch circuit are in a non-conduction state and the first switch circuit is in a conduction state in a first mode of the plurality of modes.

11. The wireless communication device of claim 10, wherein
the first switch circuit and the third switch circuit are in a non-conduction state and the second switch circuit is in a conduction state in a second mode of the plurality of modes, the first and second modes having different gains.

12. The wireless communication device of claim 11, wherein
the first switch circuit and the second switch circuit are in a non-conduction state and the third switch circuit is in a conduction state in a third mode of the plurality of modes, the first and third modes having different gains.

13. The wireless communication device of claim 12, wherein
in the variable gain amplifier further comprises a fourth switch circuit,
the second path is connected to the first input terminal at a first node,
the first end of the first path and the first end of the third path are connected at a second node, and
the fourth switch circuit is between the first node and the second node.

14. The wireless communication device of claim 13, wherein
the fourth switch circuit is in a non-conduction state and the first switch circuit, the second switch circuit, and the third switch circuit are in a conduction state in a fourth mode of the plurality of modes, the first and fourth modes having different gains.

15. The wireless communication device of claim 13, wherein
the variable gain amplifier further comprises:
a fifth switch circuit between a second input terminal and the second node; and
a sixth switch circuit between the second input terminal and the first end of the matching circuit.

16. The wireless communication device of claim 9, further comprising:
a bias generation circuit configured to generate control voltages for the first switch circuit, the second switch circuit and the third switch circuit.

17. The wireless communication device of claim 9, wherein the first path, the second path, the third path, and the amplifier circuit are on a silicon-on-insulator (SOI) substrate.

* * * * *